United States Patent [15] 3,686,587
Dann [45] Aug. 22, 1972

[54] VOLTAGE CONTROLLED OSCILLATOR HAVING TWO PHASE-SHIFTING FEEDBACK PATHS

[72] Inventor: Bert H. Dann, Santa Clara, Calif.

[73] Assignee: International Video Corporation, Sunnyvale, Calif.

[22] Filed: May 19, 1971

[21] Appl. No.: 141,659

Related U.S. Application Data

[62] Division of Ser. No. 842,497, July 17, 1969, abandoned.

[52] U.S. Cl. .............331/117 R, 331/36 R, 331/136, 331/168, 331/177 R

[51] Int. Cl. ............................H03b 3/04, H03b 5/12

[58] Field of Search.......331/36 R, 34, 117 R, 177 R, 331/168, 135, 136

[56] References Cited

UNITED STATES PATENTS

| | | | |
|---|---|---|---|
| 3,242,442 | 3/1966 | Ishimoto et al. | 331/135 X |
| 3,320,548 | 5/1967 | Waard | 331/135 X |

*Primary Examiner*—Roy Lake
*Assistant Examiner*—Siegfried H. Grimm
*Attorney*—Limbach, Limbach & Sutton

[57] ABSTRACT

A voltage controlled oscillator having a pair of active elements operating differentially with respect to DC inputs and differentially as amplifiers with respect to RF feedback currents. Separate feedback paths having ±45° phase shift are associated with each active element so that the sum of the phase shifts depends on the differential DC inputs to the active elements. A tuned circuit in the common feedback loop changes frequency to compensate for the phase shift, thus providing frequency control in response to the differential DC inputs.

9 Claims, 2 Drawing Figures

INVENTOR.
BERT H. DANN
BY Limbach, Limbach & Sutton
ATTORNEYS

VOLTAGE CONTROLLED OSCILLATOR HAVING TWO PHASE-SHIFTING FEEDBACK PATHS

This is a division of co-pending application Ser. No. 842,497, filed July 17, 1969 and now abandoned.

BACKGROUND OF THE INVENTION

Voltage-controlled oscillators (VCO's) are commonly employed in phase-locked loops and demodulator circuits. Typically, an input voltage is applied to the VCO to produce a frequency output change proportional to variations in the amplitude of the input. Prior art VCO's tend to be dependent on supply voltage and require a precise stable supply. Also, the frequency range and rate of change of frequency in response to the input voltage cannot be readily adjusted.

The VCO according to the present invention has two possible positive feedback paths having phase shift networks of approximately +45° shift and approximately −45° shift, respectively. A pair of transistors operate differentially insofar as DC error inputs are concerned and differentially as a pair of common-base amplifiers with paralleled collectors insofar as the RF feedback currents are concerned. As DC balance conditions are altered the relative gain in the two phase-shifted feedback paths changes. As the net phase shift around the oscillatory loop must approximate 0°, the frequency will thus be altered. With shifts of +45° and −45°, the end-point frequencies (i.e., those corresponding to complete unbalance in one direction or the other) correspond to the 3-db frequencies of the tank circuit. The spacing of these will, of course, depend on tank Q and hence on the value of the loading resistor. By altering the tank Q the end-point frequencies can be predetermined within practical limits. By altering the DC resistance between the phase shift feedback paths the differential DC gain and hence the kHz/volt gain factor can be changed. Since it is balance rather than the absolute current levels in the circuit which brings about frequency changes, stability against supply-voltage and ambient temperature changes is quite good.

DESCRIPTION OF THE PREFERRED EMBODIMENTS

Figure 1:
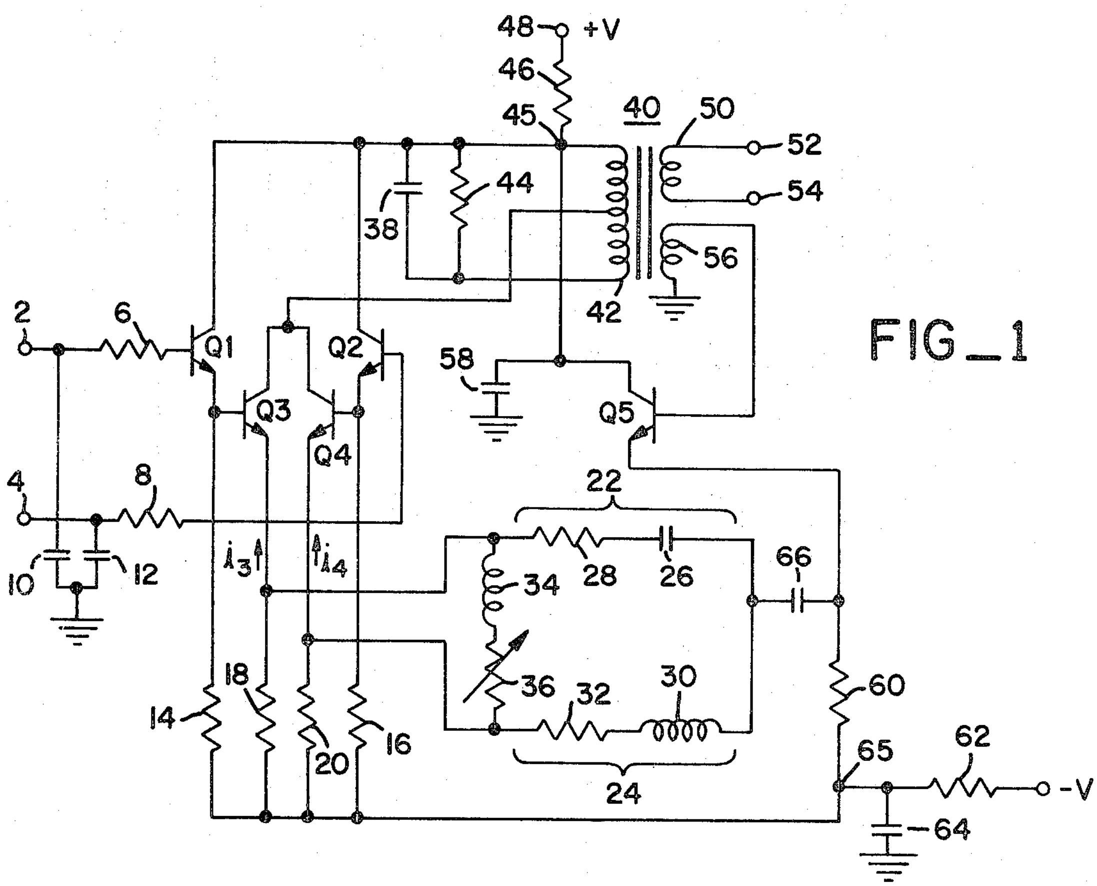
FIG. 1 is a schematic circuit diagram of the VCO according to one embodiment of the present invention.

Referring now to FIG. 1 of the drawings, a pair of NPN transistors $Q_1$ and $Q_2$ receive a pair of input signals at their respective bases via input terminals 2 and 4 and parasitic-suppression resistors 6 and 8. Capacitors 10 and 12 connected between terminals 2 and 4, respectively, and ground are by-pass capacitors. Transistors $Q_1$ and $Q_2$ provide a high impedance input for signals applied to input terminals 2 and 4 and act as current amplifiers for the base inputs of NPN transistors $Q_3$ and $Q_4$.

A pair of active devices, transistors $Q_3$ and $Q_4$ have their bases connected to the emitters of transistors $Q_1$ and $Q_2$, respectively. The bases of $Q_3$ and $Q_4$ are effectively at AC ground potential. The emitters of transistors $Q_1$, $Q_3$, $Q_4$ and $Q_2$ are connected through a decoupling resistor 62 to a negative voltage source, −V, through resistors 14, 18, 20, and 16, respectively. Resistors 14 and 16 have a substantially higher resistance then resistors 18 and 20. By-pass capacitor 64 connects between the junction of resistors 14, 18, 20, and 16 and resistor 62 at junction point 65 and ground. Transistors $Q_1$ through $Q_4$ may be on a single integrated circuit.

The collectors of $Q_3$ and $Q_4$ are connected together to a tap on primary winding 42 of a transformer 40. Winding 42, capacitor 38, and resistor 44 are elements of a parallel R-L-C circuit 43. The collectors of $Q_1$ and $Q_2$ are connected together to a junction point 45. A positive voltage source is also connected to point 45 through decoupling resistor 46. Point 45 is further connected to one end of winding 42.

Transformer 40 has a pair of secondary windings 50 and 56. Winding 50 provides an output at terminals 52 and 54. Winding 56 has one end grounded and the other end connected to the base of an emitter follower $Q_5$. The collector of $Q_5$ is connected to point 45 and bypassed to ground by capacitor 58. The emitter of $Q_5$ is connected to point 65 through a resistor 60 and through a coupling capacitor 66 to a pair of parallel branch circuits 22 and 24.

Branch 22 includes resistor 28 and capacitor 26 in series. Branch 24 includes resistor 32 and inductor 30 in series. The end of branches 22 and 24 opposite capacitor 66 has a series inductor 34 and variable resistor 36 connected therebetween. The junction of inductor 34 and resistor 28 is connected to the emitter of $Q_3$; the junction of variable resistor 36 and resistor 32 is connected to the emitter of $Q_4$.

OPERATION

The currents of the DC error signals applied to terminals 2 and 4 are amplified in $Q_1$ and $Q_2$, respectively, to drive the bases of $Q_3$ and $Q_4$ as differential amplifiers so far as the DC error inputs are concerned. As differential DC is applied between the bases of $Q_3$ and $Q_4$, the transistors "tip-over", that is, when $Q_3$ begins to cut off, $Q_4$ conducts harder and vice-versa.

$Q_3$ and $Q_4$ operate as a pair of common base amplifiers with respect to RF feedback currents. However, there are two possible feedback paths: via capacitor 26 and resistor 28 to $Q_3$ providing approximately +45° phase shift and via inductor 30 and resistor 32 to $Q_4$ providing about 45° phase shift. In the practical embodiments emitter follower $Q_5$ is used to provide a low-impedance driving source for the phase-shifting networks. As the DC balance conditions of $Q_3$ and $Q_4$ are altered, causing one or the other to conduct more heavily the relative gain in the two phase-shifted feedback paths will change; as the conduction of $Q_3$ or $Q_4$ changes the O° shift resulting from equal RF currents in branches 22 and 24 changes to a plus or minus value up to +45° or −45° (corresponding to complete unbalance in one direction or the other) ($Q_4$ cutoff or $Q_3$ cutoff). As the net phase shift around an oscillatory loop must approximate 0°, the oscillator accommodates by shifting frequency until there is an equal and opposite phase shift in the high Q R-L-C tank circuit 43. The output of the V.C.O. is taken at terminals 52 and 54.

Figure 2:
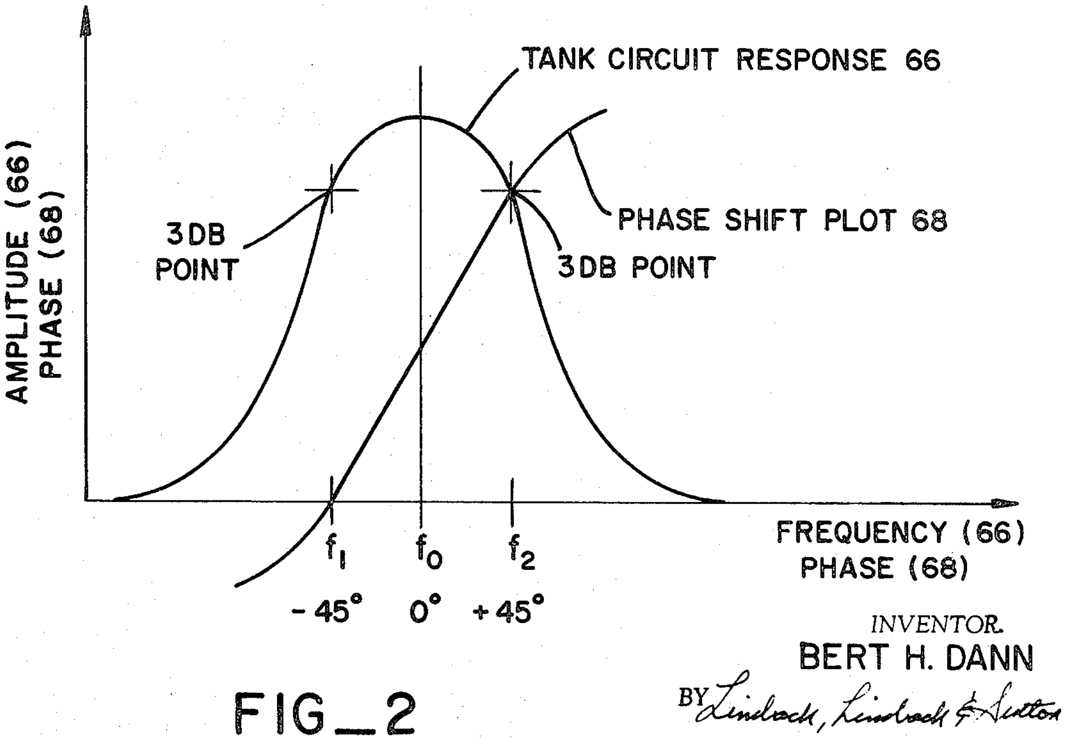
FIG. 2 is a graph of the amplitude and phase in a tank circuit.

FIG. 2 shows the amplitude characteristics of the tank circuit 66 and its phase shift characteristics 68. At resonance of the tank circuit, frequency $f_0$, the phase shift in the tank circuit is 0°. At the extremes of ±45° phase shift the tank circuit is at its 3 dB points on its resonance curve at $f_1$ and $f_2$. Thus the maximum phase shift possibly introduced by branches 22 and 24 can cause a frequency shift between $f_1$ and $f_2$. The range between $f_1$ and $f_2$ depends upon the tank circuit Q and hence on the value of loading resistor 44.

Resistor 36 may be varied to change the rate of change of frequency per volt input by varying the rate at which relative conduction in $Q_3$ and $Q_4$ changes in response to the differential inputs. Inductor 34 prevents AC signals from passing between the emitters of $Q_3$ and $Q_4$.

Since the mechanism for changing the frequency depends fundamentally on the balance of currents in $Q_3$ and $Q_4$, the power supply voltages and ambient temperature can vary within practical tolerances without causing significant frequency drift.

CIRCUIT VALUES

In one working embodiment of the invention, operating at approximately 8.8 mHz the following circuit component values were used:

| | |
|---|---|
| resistor **6** | 100 ohms |
| resistor **8** | 100 ohms |
| capacitor **10** | 0.001μF |
| capacitor **12** | 0.001μF |
| resistor **14** | 33,000 ohms |
| resistor **16** | 33,000 ohms |
| resistor **18** | 5,600 ohms |
| resistor **20** | 5,600 ohms |
| capacitor **26** | 220 pF |
| resistor **28** | 56 ohms |
| inductor **30** | 1.5μhy |
| resistor **32** | 56 ohms |
| inductor **34** | 47μhy |
| resistor **36** | 2,000 ohms |
| capacitor **38** | 75 pF |
| resistor **44** | 3,900 ohms |
| resistor **46** | 470 ohms |
| capacitor **58** | 0.01μF |
| resistor **60** | 2,200 ohms |
| resistor **62** | 10 ohms |
| capacitor **64** | 0.01μF |
| capacitor **66** | 0.01μF |

The VCO thus described provides a stable frequency output in response to DC inputs despite variations in supply voltage. The frequency range and the frequency change/volt input are easily adjusted. It will be apparent to those of ordinary skill in the art that input 2 or 4 could be grounded to provide a single ended input while retaining the differential action of the two active devices, transistors $Q_3$ and $Q_4$. For convenience, $Q_1 - Q_4$ may be on a single integrated circuit.

I claim:

1. A voltage controlled oscillator comprising a pair of active element means for operating differentially in response to DC input signals and differentially as amplifiers with respect to RF feedback currents, first feedback path means associated with one of said pair for providing a positive phase shift, second feedback path means associated with the other of said pair for providing a negative phase shift, and resonant tank circuit means in series with said pair of active element means and said first and second feedback path means.

2. The combination of claim 1 further comprising means for applying DC input signals to said pair of active element means.

3. The combination of claim 2 further comprising means for varying the differential DC gain of said active element means.

4. The combination of claim 3 further comprising means coupled to said tank circuit means for providing a variable-frequency output signal.

5. The combination of claim 4 further comprising means for varying the Q of said resonant tank circuit means.

6. The combination of claim 1 wherein said first feedback path means provides a positive phase shift of substantially +45° and said second feedback path means provides a negative phase shift of substantially –45°.

7. The combination of claim 6 wherein said first feedback path means comprises a capacitive reactance and said second feedback path means comprises an inductive reactance.

8. The combination of claim 5 wherein said means for varying the Q comprises a resistor in parallel with said tank circuit.

9. The combination of claim 5 further comprising an emitter follower in series with said tank circuit means and feedback path means.

* * * * *